United States Patent [19]

Szabo et al.

[11] Patent Number: 4,735,662

[45] Date of Patent: Apr. 5, 1988

[54] STABLE OHMIC CONTACTS TO THIN FILMS OF P-TYPE TELLURIUM-CONTAINING II-VI SEMICONDUCTORS

[75] Inventors: Louis F. Szabo, Garfield Heights; William J. Biter, Hudson, both of Ohio

[73] Assignee: The Standard Oil Company, Cleveland, Ohio

[21] Appl. No.: 714

[22] Filed: Jan. 6, 1987

[51] Int. Cl.$^4$ .................... H01L 31/06; H01L 21/443
[52] U.S. Cl. .................... 136/256; 136/260; 136/264; 357/30 J; 357/30 Q; 357/71; 357/30; 437/5; 437/185; 437/190; 437/192; 437/194
[58] Field of Search .................... 29/572, 589, 590; 427/89-91, 307; 136/256, 260, 264; 357/30 J, 30 Q, 71; 437/5, 185, 190, 192

[56] References Cited

U.S. PATENT DOCUMENTS

| | | | |
|---|---|---|---|
| 4,085,500 | 4/1978 | Hager et al. | 437/142 |
| 4,319,069 | 3/1982 | Tyan | 136/258 |
| 4,388,483 | 6/1983 | Basol et al. | 136/260 |
| 4,400,244 | 8/1983 | Kroger et al. | 204/2.1 |
| 4,425,194 | 1/1984 | Kroger et al. | 204/2.1 |
| 4,456,630 | 6/1984 | Basol | 427/88 |
| 4,524,378 | 6/1985 | Cockrum et al. | 357/71 |
| 4,548,681 | 10/1985 | Basol et al. | 204/2.1 |
| 4,650,921 | 3/1987 | Mitchell | 136/258 |
| 4,680,611 | 7/1987 | Basol | 357/71 |

OTHER PUBLICATIONS

A. L. Fahrenbruch, Solar Cells, vol. 21, pp. 399-412, (1987).
Anthony et al., "Low Resistance Contacts to P-Type Cadmium Telluride", J. of Electronic Materials, vol. 11, pp. 89-109, (1982).
Nakayama et al., "Screen Printed Thin Film CdS/CdTe Solar Cell", Jap. J. App. Phys., vol. 19, pp. 703-712, (1980).
Matsumoto et al., "Screen Printed CdS/CdTe Solar Cell of 12.8% Efficency, etc.", Solar Cells, vol. 11, (1981), pp. 367-373.
Matsumoto et al., "The Effect of CdTe Pattern on the Characteristics of Screen Printed CdS/CdTe Solar Cell", Jap. J. of App. Phys. Supp., 21-2, pp. 103-107, (1982).
Kuribayashi et al., "Preparation of Low Resistance Contact Electrode on Screen Printed CdS/CdTe Solar Cell", Jap. J. of App. Phys., vol. 22, pp. 1828-1831, (1983).
Nakano et al., "Long-Term Reliability of Screen Printed CdS/CdTe Solar-Cell Modules", Solar Cells, vol. 17, pp. 233-240, (1986).

Primary Examiner—Aaron Weisstuch
Attorney, Agent, or Firm—Joseph G. Curatolo; Larry W. Evans; Jeffery A. Wyand

[57] ABSTRACT

A stable ohmic contact for thin films of p-type tellurium-containing II-VI semiconductors and photovoltaic devices incorporating such contacts. An ohmic contact according to the invention includes a contact-forming layer deposited on a p-type thin film of a tellurium-contacting II-VI semiconductor. Preferably, the contact-forming layer is copper having a thickness of about 2 nanometers. An isolation layer is deposited on the contact-forming to isolate subsequently deposited layers from the thin film. The isolation layer may be carbon or a thin layer of nickel. A connection layer for attaching an external electrical conductor is deposited on the isolation layer. The connection layer may be aluminum, chromium or a layer of copper, provided a copper layer is covered with one of silver, aluminum or a thin layer of nickel, preferably covered with aluminum. The stable, ohmic contact may be used as a back contact in a photovoltaic device incorporating a thin film of a tellurium-containing II-VI semiconductor as one of the active semiconductor layers in the device.

28 Claims, 2 Drawing Sheets

STABLE OHMIC CONTACTS TO THIN FILMS OF P-TYPE TELLURIUM-CONTAINING II-VI SEMICONDUCTORS

BACKGROUND

This invention concerns stable ohmic contacts for, and a process for making stable ohmic contacts to, thin films of p-type tellurium-containing II-VI semiconductors and electronic devices, particularly photovoltaic devices, incorporating the novel stable contacts.

Photovoltaic devices incorporating layers of tellurium-containing II-VI semiconductors offer substantial promise in terms of conversion efficiency, cost and ease of manufacture. As used here, the term tellurium-containing II-VI semiconductors refers to semiconductors containing tellurium and one or more elements selected from Group IIB of the Periodic Table of the Elements, as published by the American Chemical Society, including mercury cadmium telluride, cadmium telluride, cadmium zinc telluride, mercury zinc telluride, zinc telluride and mercury telluride. Of these semiconductors, cadmium telluride, mercury cadmium telluride, cadmium zinc telluride and zinc telluride offer particular promise. Of the II-VI tellurium-containing semiconductors, cadmium telluride and mercury cadmium telluride have probably been the subject of the most research. These materials can be prepared by a number of techniques. For example, monocrystalline cadmium telluride can be prepared by the Bridgeman technique. Thick films of cadmium telluride can be prepared by sintering a screen printed, dried paste of cadmium and tellurium particles. These thick films, e.g. 20 micrometers thick, are sintered at rather high temperatures (about 600° to 700° C.) to react the particles of cadmium and tellurium to form cadmium telluride. Thin films of cadmium telluride can be conveniently electrodeposited as disclosed in U.S. Pat. Nos. 4,400,244 and 4,425,194. Thin films of cadmium-rich mercury cadmium telluride can be electrodeposited following the disclosure of U.S. Pat. No. 4,548,681. The electrodeposited cadmium telluride-containing thin films generally exhibit n-type conductivity, but may be converted to p-type conductivity by heat treating in accordance with the disclosure of U.S. Pat. No. 4,388,483. An ohmic contact to electrodeposited thin films of cadmium telluride-containing semiconductors may be prepared according to the disclosure of U.S. Pat. No. 4,456,630. The disclosures of the cited patents are incorporated herein by reference.

While ohmic contacts to crystals and films of p-type tellurium-containing II-VI semiconductors have been successfully made by various processes, including by the method disclosed in U.S. Pat. No. 4,456,630, we have observed that some ohmic contacts to thin films of p-type tellurium-containing II-VI semiconductors do not remain stable over time. For example, gold contacts on electrodeposited cadmium telluride and mercury cadmium telluride that were prepared according to the '630 patent have been observed to react with or diffuse into the tellurium-containing semiconductor. As discussed below, previously known copper-nickel contacts have been observed to form flakes that detach from the semiconductor. In order to prepare photovoltaic devices containing thin films of p-type tellurium-containing II-VI semiconductors that are useful over reasonable lifetimes, ohmic contacts having long term stability must be easily and cheaply prepared.

Accordingly, it is a principal object of this invention to prepare ohmic contacts to thin films of p-type tellurium-containing II-VI semiconductors that are stable over a long period of time.

It is another object of this invention to make an ohmic contact to a thin film of p-type tellurium-containing II-VI semiconductors requiring only simple, low cost processing steps and materials.

It is a further object of this invention to achieve a photovoltaic device including a thin film of a p-type tellurium-containing II-VI semiconductor and incorporating a stable ohmic contact.

SUMMARY OF THE INVENTION

In the invention, a method of forming an ohmic contact to a thin film of a tellurium-containing II-VI semiconductor material and a photovoltaic device incorporating the stable ohmic contact is provided. In one embodiment of the invention, the surface of a cadmium telluride-containing thin film is prepared using a known technique. Thereafter, a contact-forming layer of a metal that forms a good mechanical and electrical contact is deposited on the prepared surface. For example, a layer of copper 2 nm thick adheres well to p-type cadmium telluride-containing semiconductors, but includes too few atoms to act as a doping source that could short circuit the thin film. An isolation layer is deposited on the contact-forming layer. The isolation layer avoids undesired diffusion of metal atoms from subsequently deposited layers into the semiconductor and/or formation of a blocking contact between those layers and the semiconductor. Among the candidates for an isolation layer are carbon and thin layers of nickel. A relatively thick connection layer is deposited on the isolation layer to facilitate connection of an external electrical conductor to the ohmic contact. The connection layer can be a single layer of aluminum or silver or multiple metallic layers, such as a layer of copper covered with a thin layer of nickel or aluminum. All of the layers of materials in the novel contact may be deposited by established vacuum deposition techniques. The novel contact requires no heat treatment that could damage the underlying semiconductors.

In a photovoltaic device, the novel ohmic contact may form a non-transparent or "back" contact to the device. The device may conveniently include a transparent substrate, such as glass coated with a transparent, electrically conducting layer, such as tin oxide or indium tin oxide, to form a first electrode or contact to the device. A layer of a first semiconductor material, such as cadmium sulfide, is deposited on the first electrode by any convenient method such as electrodeposition. A thin film of a p type tellurium-containing II-VI semiconductor, such as cadmium telluride or mercury cadmium telluride, is disposed on the first semiconductor layer to form a photoresponsive junction. The ohmic contact described in the previous paragraph is then formed on the tellurium-containing II-VI semiconductor film. The ohmic contact may be formed by sequential vacuum evaporation of sources of the constituents of each layer and condensation of the vapors.

BRIEF DESCRIPTION OF THE DRAWING FIGURES

DETAILED DESCRIPTION OF PREFERRED EMBODIMENTS

Figure 1:
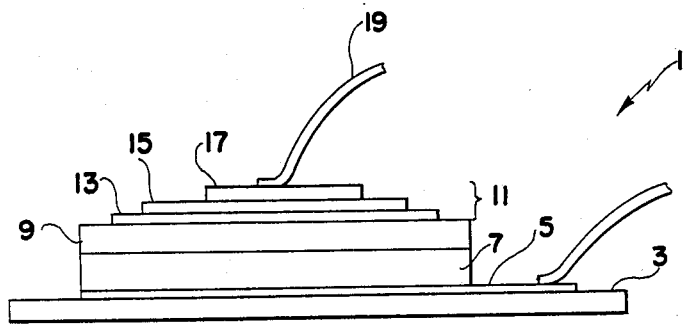
FIG. 1 is a schematic sectional diagram of a photovoltaic device according to the invention.

In the invention, stable ohmic contacts to thin films of p-type tellurium-containing II–VI semiconductor materials are made. The term thin film as used here means a film having a thickness not exceeding about 3 micrometers. Tellurium-containing II–VI semiconductors include cadmium telluride, mercury cadmium telluride, cadmium zinc telluride, zinc telluride, mercury zinc telluride and mercury telluride. These semiconductors may exhibit p-type conductivity either as deposited or after a heat treatment changing their conductivity type and/or may be intentionally doped by incorporation of electronically active impurities. While the invention is not limited to use with electrodeposited thin films of II–VI semiconductors containing cadmium and tellurium, it is particularly useful with those polycrystalline films electrodeposited as disclosed in the U.S. patents incorporated by reference in this disclosure.

A method of making ohmic contacts to p-type II-VI semiconductors containing cadmium tellurium is disclosed in U.S. Pat. No. 4,456,630 (the '630 patent). There, an electrodeposited thin film of cadmium telluride was first etched briefly (e.g., 2 seconds) in a solution containing one volume of 98 weight percent sulfuric acid and one volume of saturated potassium dichromate (sold under the trademark Dichrol). The acid-etched surface was immersed in a hydrazine solution, an alkaline solution, for about one minute. The treated surface was finally coated with gold, from an evaporated source, to make an ohmic contact to the p-type cadmium telluride. The use of other metals, namely, platinum, silver and copper, for the metallic layer is suggested in the claims of the patent.

We have found the acid-alkaline surface preparation steps described in the '630 patent are useful. We prefer to modify the steps slightly by reducing the acidity of the Dichrol solution so that the etching time is longer and need not be so precisely controlled. We have found that a solution of 19 volumes of 50 weight percent sulfuric acid mixed with one volume of dichromate produces good results in a five second etch.

As already discussed, gold deposited on the acidalkaline prepared surface does not form a stable, i.e., long lasting contact. In general, gold reacts wtih and/or is diffused into tellurium-containing II–VI semiconductors so that the contact is lost. It is now known in the art that copper makes a good ohmic contact to the surface of a thin film of a p-type cadmium telluride-containing semiconductor that has been prepared according to the sequential acidic and alkaline treatment steps disclosed in the '630 patent. However, it is also known that copper readily diffuses into tellurium-containing II–VI semiconductors. If sufficient quantities of copper are available, copper will diffuse through the entire thickness of a thin film of a tellurium-containing II–VI semiconductor, making the thin film useless in a semiconductor or photovoltaic device.

Still, copper is useful for forming a contact to tellurium-containing II–VI semiconductor thin films because of its excellent adhesion and electrical properties. One solution to the copper diffusion problem is limitation of the amount of copper available on the semiconductor surface as a diffusion source. The amount of copper available may be simply controlled by limiting the thickness of the copper layer. For example, a copper layer about 1 to 5 nanometers (nm) thick deposited on a film containing cadmium and tellurium and about 1.5 micrometers in thickness contains too few atoms to damage the film by diffusing into it. However, such a thin copper contact-forming layer has an inherently and intolerably high resistivity and is almost impossible to contact directly with a wire or lead without severely damaging the layer and underlying thin film.

In order to increase the thickness of the ohmic contact so that an external electrical connection can be made to it, a different material must be deposited on the thin contact-forming layer. Copper-nickel contacts to cadmium telluride films are known, but are unsatisfactory. Nickel has a relatively low resistivity and therefore must be deposited in a relatively thick layer to achieve an acceptable resistance. For example, a nickel film two hundred nm or more in thickness is required in order to produce an acceptably low resistance layer. However, we have found that thick films of nickel on copper on a II–VI semiconductor are mechanically unstable. Evaporated nickel films 100 nm or more in thickness on copper tend to retain internal stresses. Unprotected, thick nickel films on copper have been observed to oxidize over time and to flake off under the influence of the internal film stresses. We have found that satisfactory nickel-copper contacts can be produced by depositing a relatively thin and, therefore, stress-free layer of nickel on a copper contact-forming layer. For example, a 50 nm thick layer of nickel on a 2 nm thick copper contact-forming layer provides a good mechanical and electrical contact. The thin nickel layer is preferably covered with another metal layer such as aluminum, for protection of the nickel from oxidation and to provide sufficient metal thickness for bonding of an external contact without unacceptable damage to the nickel and copper layers. External contact via wire bonding or the like to an aluminum layer can readily be made by known technology. As is known, aluminum cannot be used to contact p-type tellurium-containing II–VI semiconductors directly because it forms a blocking contact. Thus, a nickel layer is an appropriate isolation layer for isolating the outermost connection layer, e.g., aluminum, from the semiconductor.

We have found that another useful isolation layer can be formed from carbon. The surface of a cadmium telluride-containing semiconductor is first sequentially treated with the acid and alkaline solutions as already described. Then a thin contact-forming layer, such as 2 nm of copper, is deposited. A layer of carbon is deposited on the contact-forming layer, preferably by vacuum evaporation and condensation. The carbon layer should be thick enough to be opaque, at least 50 nm and, preferably, 100 nm thick. Carbon is a very effective isolation layer and does not permit diffusion of copper through it. Therefore, a second copper layer may be deposited on the carbon for making a wire bond or other external contact without concern that copper from the second layer will diffuse through to the tellurium-containing II–VI semiconductor. Preferably, the second copper, connection layer is coated with another metal, such as aluminum or silver, to protect the second copper layer from oxidation. As an alternative to a second copper layer, a layer of aluminum or a layer of copper covered with a thin layer of nickel may be deposited on the carbon layer as a connection layer to complete the ohmic contact. In the latter case, aluminum may be deposited on the nickel as a protective coating, if desired. Deposition of nickel directly on the carbon is not desirable, but other metals that make good electrical and mechanical contact to carbon, such as chromium, may be employed in direct contact with the carbon layer as a connection layer.

A photovoltaic cell employing embodiments of the invention is shown in FIG. 1 in a schematic, sectional view. FIG. 1 is not drawn to any scale. Cell 1 includes a light transmissive substrate 3, typically glass. A layer 5 of a transparent, electrically conductive material is disposed on substrate 3 as a first electrode. Appropriate materials for layer 5 are transparent, electrically conductive oxides, such as tin oxide or tin oxide doped with indium. A wire 6 forming a first electrical terminal of the cell makes electrical contact to layer 5 possibly via a thin metallic film (not shown). A thin film of a first semiconductor layer 7, preferably n-type cadmium sulfide, is disposed on electrode 5. Preferably, a cadmium sulfide layer is electrodeposited, although it may be deposited by other known techniques such as vacuum evaporation and condensation. A thin film of a p-type tellurium-containing II–VI semiconductor layer 9 is disposed on layer 7 to form a photoresponsive heterojunction. Thin film 9 may be electrodeposited cadmium telluride or mercury cadmium telluride that has been converted to p-type conductivity by heat treatment.

An ohmic contact 11 is formed on thin film 9 having the structure described above. After the surface of the tellurium-containing thin film 9 is sequentially treated in acid and alkaline solutions as already described, a contact-forming layer 13 is deposited on it, such as about 2 nm of copper. Thereafter, an isolation layer 15, such as carbon or nickel is deposited on the contact-forming layer to isolate it from subsequently deposited layers. Finally, a connection layer 17 of one or more metals is applied to isolation layer 15 so that the second electrical terminal to cell 1 may be completed. Unlike known contacts to screen printed thick film cadmium telluride-containing semiconductors, no heat treatment that might damage thin film 9 is required to make the multiple layer ohmic contact operational. A wire 19 is bonded to the connection layer 17 of ohmic contact 11 by any known means such as welding, soldering or adhering with a mass of an electrically conductive adhesive, to form the second terminal of cell 1. Alternatively, for testing purposes, an electrically conducting probe may touch the onnection layer to establish electrical communication with an external device.

Figure 2:
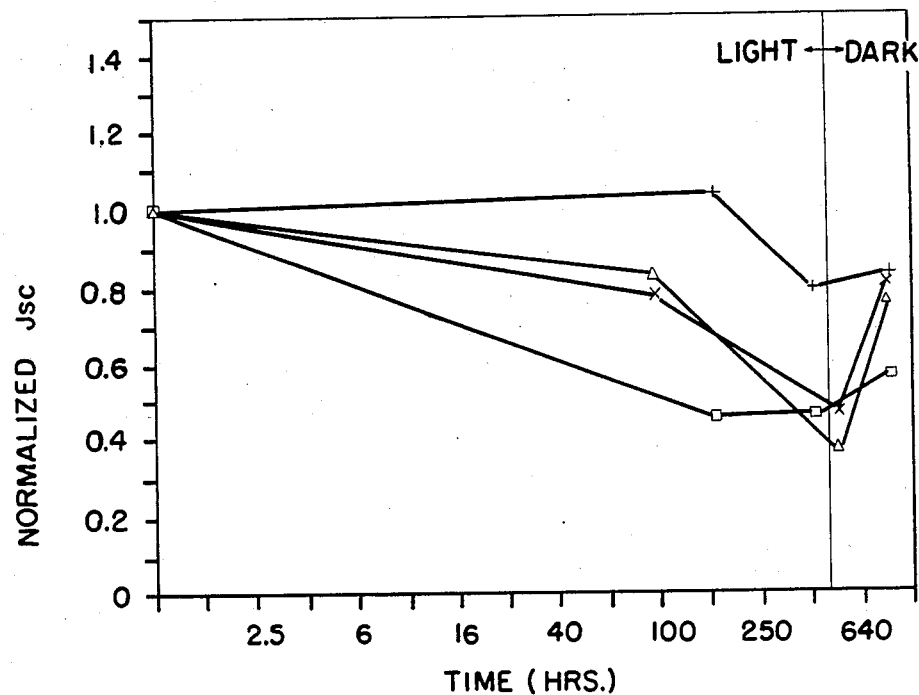
FIG. 2 is a graph of the normalized short circuit current density over time of photovoltaic devices according to and not according to the invention, measured during and after illumination.
Figure 3:
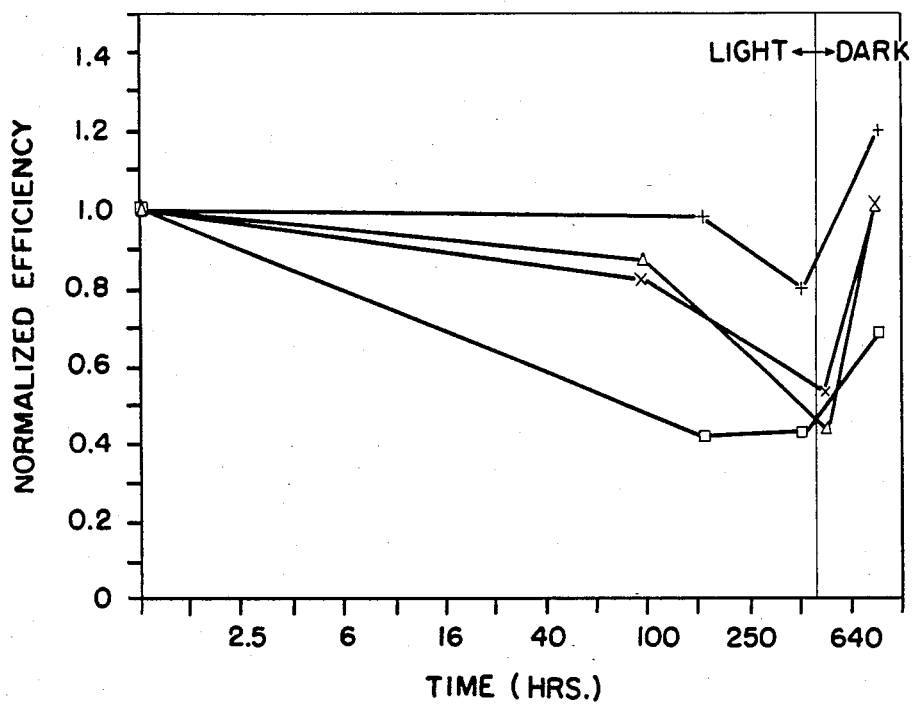
FIG. 3 is a graph of the normalized efficiency over time of photovoltaic devices according to and not according to the invention, measured during and after illumination.

Embodiments of the novel ohmic contact have shown substantial improvements in stability over known contacts. FIGS. 2 and 3 are measured responses over time of cadmium sulfide-cadmium telluride photovoltaic cells of the type depicted in FIG. 1. The transparent electrode of the cells was indium tin oxide contacted by a one micrometer thick layer of aluminum. All cells had an area of about one square centimeter. On the conventional cells, the rear contact or second electrode was a layer of copper 5 nm thick coated with a layer of nickel 100 nm thick. The cells according to an embodiment of the invention included a rear contact having a copper contact-forming layer 5 nm thick covered with 50 nm of carbon. The carbon layer was coated with 3 nm of copper and 70 nm of nickel. The layers in the rear contacts were deposited by sequentially heating sources of each of the layers in a vacuum chamber with an electron beam.

The normalized, measured values of short circuit current density and efficiency of the conventional cells and of cells according to the invention, over time, are plotted in FIGS. 2 and 3, respectively. The measured values for the cells according to the invention are indicated by + symbols. All measurements were taken at intervals during otherwise continuous light exposure in a solar simulator for a period of about 460 hours. The continuous exposure in the solar simulator represented an accelerated life test since the cells would ordinarily be exposed to the light-dark diurnal cycle. Temporary electrical connections to the cells for the measurements were established with probes. After the period of continuous light exposure, all cells were removed from the solar simulator and further measurements were made while the cells were in darkness, i.e., ambient light. As seen in FIGS. 2 and 3, short circuit current density and efficiency improved for all cells in darkness after the light exposure. More importantly, FIGS. 2 and 3 show that no degradation in short circuit current density or efficiency appeared in cells according to the invention until after 150 hours of light exposure. Cells with known copper-nickel contacts showed earlier and larger degradation and never performed at higher normalized short circuit current density or efficiency than the novel cells. In fact, only at the final measurement, in the dark, did any cell perform nearly as well as the novel cells in terms of normalized short circuit current density and efficiency (see FIG. 2). Based on our measurement experience with cadmium telluride cells having gold and other contacts, these results indicate that the novel contact when used at the rear (the non-illuminated contact) of the cell is far more stable and performs much better than previously known contacts. The elimination of gold and the use of more common metals in the novel ohmic contact also means that cost is reduced. Moreover, the process of making the novel contact is simple and only requires conventional equipment.

The invention has been described with respect to certain preferred embodiments. Various modificatons within the spirit of the invention will occur to those of skill in the art. Accordingly, the scope of the invention is limited solely by the following claims.

We claim:

1. A method of making an ohmic contact to a thin film of a p-type tellurium-containing II–VI semiconductor comprising:
    depositing a metallic contact-forming layer on a thin film of a p-type tellurium-containing II–VI semiconductor in a thickness sufficient to form an adherent, electrically conductive contact to the thin film, but insufficient to act as a source of dopant atoms to said thin film;
    depositing an electrically conducting isolation layer on said contact-forming layer to isolate subsequently deposited layers from said thin film; and
    depositing an electrically conducting connection layer on said isolation layer for connecting an external electrical conductor to said ohmic contact.

2. The method of claim 1 including depositing a layer of copper having a thickness of between 1 and 5 nanometers as said contact-forming layer.

3. The method of claim 2 including depositing said layer of copper to a thickness of about 2 nanometers.

4. The method of claim 1 including depositing a layer of carbon having a thickness of at least 50 nanometers as said isolation layer.

5. The method of claim 4 including depositing a layer of aluminum on said layer of carbon as said connection layer.

6. The method of claim 4 including depositing on said layer of carbon a layer of copper as part of said connection layer.

7. The method of claim 6 including depositing on said copper layer, as part of said connection layer, a layer of nickel less than 100 nanometers thick.

8. The method of claim 7 including depositing on said layer of nickel, as part of said connection layer, a layer of aluminum.

9. The method of claim 6 including depositing on said copper layer, as part of said connection layer, a layer of one of aluminum and silver.

10. The method of claim 4 including depositing on said layer of carbon a layer of chromium as said connection layer.

11. The method of claim 1 including depositing a layer of nickel less than 100 nanometers thick as said isolation layer.

12. The method of claim 11 including depositing on said nickel layer a layer of aluminum as said connection layer.

13. The method of claim 1 including depositing each of said layers in a vacuum by sequentially evaporating a source of each of said layers and sequentially condensing the vapors of each evaporated source.

14. The method of claim 1 including preparing a surface of said thin film before depositing said contact-forming layer on said prepared surface, comprising first treating said surface with an acidic solution and subsequently treating said surface with an alkaline solution.

15. A photovolatic device comprising:
a light transmissive substrate;
an electrically conductive, transparent layer disposed on said substrate as a first electrode;
a layer of a first semiconductor disposed on said first electrode;
a p-type thin film of a tellurium-containing II-VI semiconductor disposed on said first semiconductor to form a photoresponsive junction with it; and
a second electrode contacting said thin film, said second electrode including: a metallic contact-forming layer disposed on said thin film in a thickness sufficient to form an adherent, electrically conductive contact to said thin film, but insufficient to act as a source of dopant atoms to said thin film; and an electrically conductive isolation layer disposed on said contact-forming layer to isolate additional layers from said thin film; and an electrically conducting connection layer disposed on said isolation layer for connecting an external electrical conductor contact to said second electrode.

16. The device of claim 15 wherein said thin film is selected from the group consisting of cadmium telluride, mercury cadmium telluride, zinc telluride, cadmium zinc telluride, mercury zinc telluride, and mercury telluride.

17. The device of claim 15 wherein said first semiconductor comprises n-type cadmium sulfide.

18. The device of claim 15 wherein said contact-forming layer comprises a layer of copper having a thickness of between 1 and 5 nanometers.

19. The device of claim 18 wherein said contact-forming layer is about 2 nanometers thick.

20. The device of claim 15 wherein said isolation layer comprises a layer of carbon having a thickness of at least 50 nanometers.

21. The device of claim 20 wherein said connection layer comprises a layer of aluminum disposed on said layer of carbon.

22. The device of claim 20 wherein said connection layer comprises a layer of copper disposed on said layer of carbon.

23. The device of claim 22 wherein said connection layer includes a layer of nickel not exceeding 100 nanometers in thickness disposed on said copper layer opposite said carbon layer.

24. The device of claim 23 wherein said connection layer includes a layer of aluminum disposed on said layer of nickel opposite said layer of copper.

25. The device of claim 22 wherein said connection layer comprises a layer of one of aluminum and silver disposed on said layer of copper opposite said layer of carbon.

26. The device of claim 20 wherein said connection layer comprises a layer of chromium disposed on said layer of carbon.

27. The device of claim 15 wherein said isolation layer comprises a layer of nickel not exceeding 100 nanometers in thickness.

28. The device of claim 27 wherein said connection layer comprises a layer of aluminum disposed on said nickel layer opposit said contact-forming layer.

* * * * *